(12) United States Patent
Gotoda

(10) Patent No.: US 11,050,215 B2
(45) Date of Patent: Jun. 29, 2021

(54) VARIABLE WAVELENGTH LASER DEVICE AND VARIABLE WAVELENGTH LASER DEVICE PRODUCTION METHOD

(71) Applicant: Mitsubishi Electric Corporation, Chiyoda-ku (JP)

(72) Inventor: Mitsunobu Gotoda, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 23 days.

(21) Appl. No.: 16/619,253

(22) PCT Filed: Dec. 28, 2017

(86) PCT No.: PCT/JP2017/047215
§ 371 (c)(1),
(2) Date: Dec. 4, 2019

(87) PCT Pub. No.: WO2018/235317
PCT Pub. Date: Dec. 27, 2018

(65) Prior Publication Data
US 2020/0176949 A1 Jun. 4, 2020

(30) Foreign Application Priority Data

Jun. 23, 2017 (JP) .............................. JP2017-123172

(51) Int. Cl.
*H01S 5/02255* (2021.01)
*H01S 5/042* (2006.01)
(Continued)

(52) U.S. Cl.
CPC ........ *H01S 5/02255* (2021.01); *H01S 5/0234* (2021.01); *H01S 5/04256* (2019.08); *H01S 5/068* (2013.01); *H01S 5/142* (2013.01)

(58) Field of Classification Search
CPC .. H01S 5/02255; H01S 5/0261; H01S 5/0234; H01S 5/14; H01S 5/142; H01S 5/068; G02B 6/26
See application file for complete search history.

(56) References Cited

U.S. PATENT DOCUMENTS 9,778,420 B2 * 10/2017 Shimizu .................... G02B 6/34
10,921,525 B2 * 2/2021 Kojima .............. G02B 6/12004
(Continued)

FOREIGN PATENT DOCUMENTS

| JP | 2010-87472 A | 4/2010 |
| JP | 2011-253930 A | 12/2011 |
| WO | WO 2013/145195 A1 | 10/2013 |

OTHER PUBLICATIONS

International Search Report dated Mar. 20, 2018 in PCT/JP2017/047215 filed Dec. 28, 2017.

*Primary Examiner* — Tuan N Nguyen
(74) *Attorney, Agent, or Firm* — Xsensus LLP

(57) ABSTRACT

This variable wavelength laser device comprises a first semiconductor chip having first and second waveguides disposed in parallel, and a second semiconductor chip having an optical circuit optically connected to the first and second waveguides that, in conjunction with the first and second waveguides, constitute a resonator. Each of the first and second waveguides has two or more surface electrodes. The second semiconductor chip has a plurality of electrodes joined to the surface electrodes of the first and second waveguides.

8 Claims, 9 Drawing Sheets

(51) Int. Cl.
  *H01S 5/068* (2006.01)
  *H01S 5/14* (2006.01)
  *H01S 5/0234* (2021.01)

(56) References Cited

U.S. PATENT DOCUMENTS

| | | | |
|---|---|---|---|
| 2003/0086655 A1* | 5/2003 | Deacon | H01S 5/06256 385/50 |
| 2009/0003762 A1* | 1/2009 | Chiniwalla | G02B 6/1228 385/14 |
| 2015/0016767 A1 | 1/2015 | Akiyama | |

* cited by examiner

Fig.1A
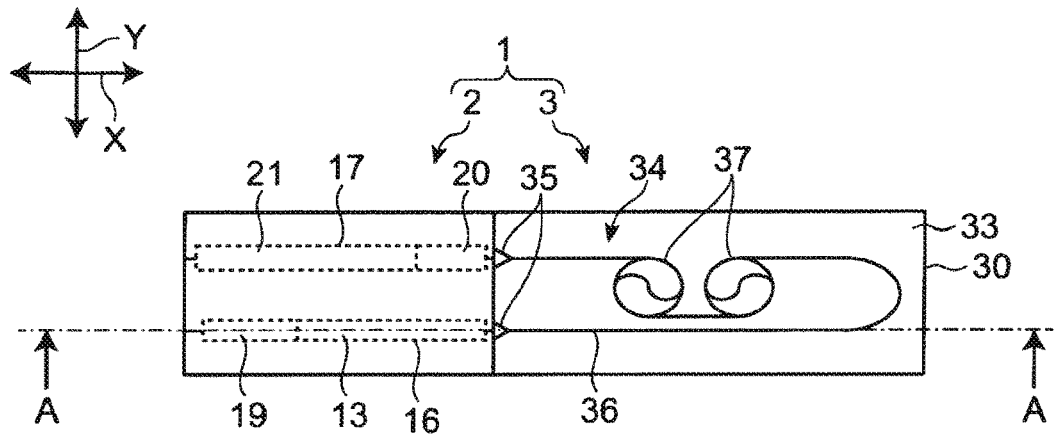
Fig.1B
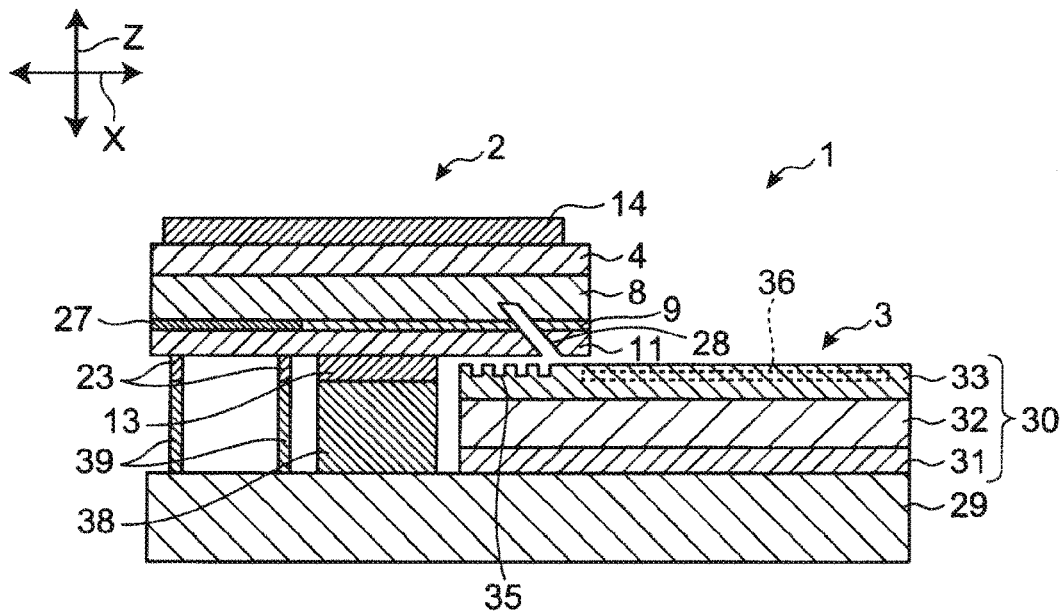
Fig.2

VARIABLE WAVELENGTH LASER DEVICE AND VARIABLE WAVELENGTH LASER DEVICE PRODUCTION METHOD

TECHNICAL FIELD

The present invention relates to a variable wavelength laser device available in an optical communication system.

BACKGROUND ART

In recent years, with increase in communication capacity as a backdrop, optical fiber communication is shifting from a conventional intensity modulation method to a phase modulation method. Examples of the phase modulation method include multi-level phase modulation, in particular, such as a phase shift keying (PSK) method and a quadrature amplitude modulation (QAM) method, whose application has been advanced.

As a semiconductor laser (LD), there is required not only a conventional distributed feedback LD (DFB-LD: Distributed Feedback LD), a distributed Bragg reflector LD (DBR-LD), but also a variable wavelength laser device that covers C (conventional) bands and L (long) bands of optical communication.

The multi-level phase modulation method requires a narrow line width light source on the order of 10 kHz to 100 kHz. However, the DFB-LD and the DBR-LD each have a value of an oscillation spectrum line width (hereinafter, referred to as a line width) of about several MHz or less. This requires the line width of each of the DFB-LD and the DBR-LD to be narrowed, and it is conceivable that increasing a resonator length (typically a chip size) to 1500 microns to 2000 microns or more, for example, is theoretically effective.

However, simply increasing the resonator length sacrifices light output, and a side mode suppression ratio (SMSR) requiring at least 30 dB to 40 dB, and thus impairs mode stability.

Meanwhile, in an external cavity semiconductor laser having a configuration in which a semiconductor optical amplifier (SOA), which is a compound semiconductor chip of III-V group, is added to a resonator composed of optical components such as a reflector and an etalon, the line width can be narrowed relatively easily. However, its module size is increased, so that reliability including impact resistance needs to be improved. To solve the problem, it is conceivable to use a configuration without a mechanically movable part in which a compound semiconductor chip and an external resonator formed using silicon photonics technology that has developed significantly in recent years are integrated by hybrid integration.

Patent Document 1 discloses an optical semiconductor device formed by combining a semiconductor optical amplifier, and an optical wavelength selection element composed of a ring resonator based on a silicon waveguide, a diffraction grating, and the like, to suppress fluctuation of output light regardless of temperature change.

Patent Document 2 discloses an optical semiconductor device in which a resonator is composed of a semiconductor optical amplifier chip provided on its one end face with a high reflection film coated and a loop mirror of a silicon waveguide, and an optical modulator composed of a plurality of ring resonators is integrated.

Patent Document 3 discloses a variable wavelength laser device in which semiconductor optical amplifiers each provided on its one end face with a high reflection film coated, having a different gain spectrum, are disposed in respective two input ports of a variable wavelength ring resonator provided on its output side with a dielectric multilayer film coated.

PRIOR ART DOCUMENTS

Patent Documents

Patent Document 1: JP 2011-253930 A
Patent Document 2: WO 2013/145195
Patent Document 3: JP 2010-87472 A

SUMMARY OF THE INVENTION

Problems to be Solved by the Invention

In Patent Documents 1 to 3, the semiconductor optical amplifier and an external optical circuit are optically connected by a butt-joint junction. This configuration requires typically alignment with high accuracy, specifically, submicron accuracy, to suppress coupling loss at 1 dB or less. However, alignment with high accuracy with submicron accuracy requires a long time, for example, so that manufacturing cost increases. In particular, when bonding is required at two or more places as in Patent Document 3, time required for alignment is further increased, and thus mass productivity of the laser device is impaired.

The present invention is made to solve the above-described problem, and it is an object of the present invention to provide a variable wavelength laser device capable of reducing requirements for alignment accuracy, having a small size and a narrow line width.

Means for Solving the Problems

A variable wavelength laser device according to the present invention includes a first semiconductor chip having first and second waveguides disposed in parallel with each other, a second semiconductor chip having an optical circuit that is optically connected to the first and second waveguides and constitutes a resonator in cooperation with the first and second waveguides, the first and second waveguides each having two or more front surface electrodes, and the second semiconductor chip having a plurality of electrodes bonded to the corresponding front surface electrodes of the first and second waveguides.

Effects of the Invention

According to the present invention, the resonator includes the first and second waveguides disposed in parallel with each other in the first semiconductor chip and the optical circuit provided in the second semiconductor chip as components, so that increase in length of the resonator enables obtaining a variable wavelength laser device with a narrow line width. In addition, the front surface electrode provided in the waveguide of the first semiconductor chip is bonded to the electrode of the second semiconductor chip, so that both reduction in line width and reduction in size of the variable wavelength laser device can be achieved. Furthermore, flip chip bonding can be used for bonding the first semiconductor chip and the second semiconductor chip, so that the alignment accuracy at the time of bonding can be improved to the order of microns, for example.

BRIEF DESCRIPTION OF THE DRAWINGS

FIG. 1A is a plan view illustrating a variable wavelength laser device according to a first embodiment of the present invention.

FIG. 1B is a cross-sectional view of FIG. 1A taken along line A-A and viewed in a direction of each arrow.

FIG. 3 is a cross-sectional view illustrating a first semiconductor chip.

EMBODIMENTS OF THE INVENTION

Figure 3A:
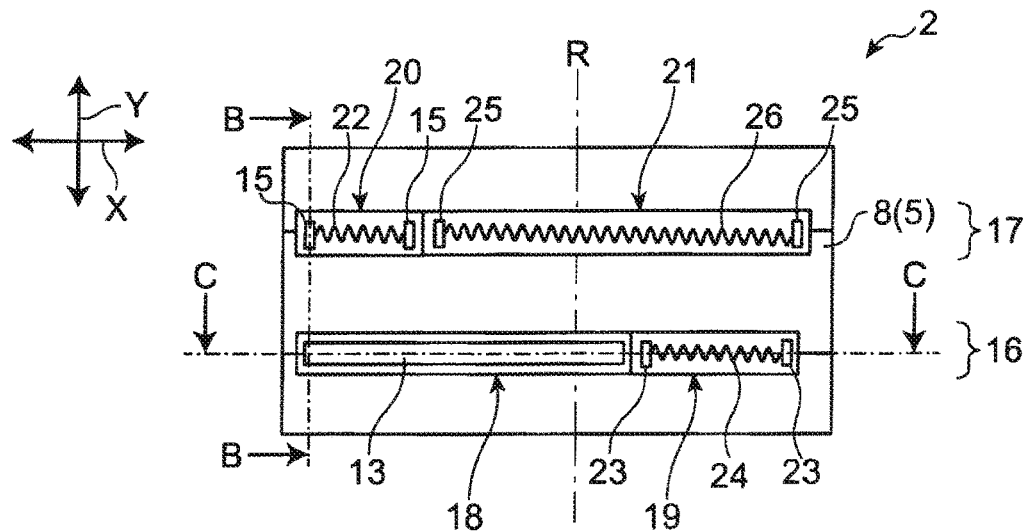
FIG. 3A is a plan view illustrating the first semiconductor chip.

Hereinafter, embodiments of the present invention will be described with reference to the accompanying drawings. In each of the drawings, the same or similar components are denoted by the same reference numerals. In addition, detailed descriptions of already known matters may be eliminated to avoid unnecessarily making the description redundant and to facilitate understanding of those skilled in the art. To facilitate understanding of description, arrows indicating directions are provided in each drawing. X-direction, Y-direction, and Z-direction are perpendicular to each another. In the description, the X-direction may be referred to as a longitudinal direction, the Y-direction as a width direction, and the Z-direction as a height direction or a vertical direction. The terms indicating these directions are exemplary and should not be understood as limiting the present invention.

First Embodiment

[1. Laser Resonator]

FIG. 1A is a plan view illustrating a variable wavelength laser device 1 according to a first embodiment of the present invention, and FIG. 1B is a cross-sectional view of FIG. 1A taken along line A-A and viewed in a direction of each arrow. As illustrated, the variable wavelength laser device 1 includes a first semiconductor chip 2 and a second semiconductor chip 3. Although described later in detail, the first semiconductor chip 2 is bonded to the second semiconductor chip 3 by flip chip bonding. In the variable wavelength laser device 1, the first semiconductor chip 2 and the second semiconductor chip 3 cooperate to constitute a resonator (optical resonator). Hereinafter, a configuration of each of the first semiconductor chip 2 and the second semiconductor chip 3 will be described in detail.

[2. First Semiconductor Chip]

FIG. 2 is a cross-sectional view illustrating the first semiconductor chip 2. FIG. 2 is a cross-sectional view of FIG. 3A described below, taken along line B-B, and viewed in a direction of each arrow. As illustrated, the first semiconductor chip 2 has a so-called double heterostructure including an N-type substrate 4, an N-type clad layer (or a lower clad layer) 8 provided on the N-type substrate 4, having a flat portion 5 and two ridge portions 6, 7, an active layer 9 provided on the ridge portion 6 of the N-type clad layer 8, a passive layer 10 provided on the ridge portion 7 of the N-type clad layer 8, and P-type clad layers 11, 12 (or first and second upper clad layers) provided on the active layer 9 and the passive layer 10, respectively. The first semiconductor chip 2 has an exemplary chip size of about 500 μm by 1000 μm.

The first semiconductor chip 2 is formed of a compound semiconductor. The N-type substrate 4, the N-type clad layer 8, and the P-type clad layers 11, 12, are each made of indium phosphide (InP), and each contain a suitable dopant. The active layer 9 and the passive layer 10 may be each made of indium gallium arsenide phosphide (InGaAsP). The active layer 9 may be composed of multiple quantum wells (MQW) or may be composed of a bulk epitaxial layer.

In the cross section illustrated in FIG. 2, a P-side electrode 13 being a front electrode of the semiconductor chip 2 is provided on the P-type clad layer 11, and the N-type substrate 4 is provided on its lower surface with an N-side electrode 14 being a back surface electrode of the semiconductor chip 2. When forward bias voltage is applied between the P-side electrode 13 and the N-side electrode 14, a current can be injected into the active layer 9, whereby light can be generated. In the cross section illustrated in FIG. 2, a heater electrode 15 being a front surface electrode of the semiconductor chip 2 is also provided on the P-type clad layer 12.

The ridge portion 6 of the N-type clad layer 8, the active layer 9, and the P-type clad layer 11 constitute a first waveguide 16, and the ridge portion 7 of the N-type clad layer 8, the passive layer 10, and the P-type clad layer 12 constitute a second waveguide 17. The first waveguide 16 is provided with two or more front surface electrodes including the P-side electrode 13. The second waveguide 17 is provided with two or more front electrodes including the heater electrode 15. FIG. 2 illustrates ridge waveguides. While in the present embodiment, an example in which two waveguides (optical waveguides) are provided is described, the present invention is not limited to this, and three or more waveguides may be provided.

While a contact layer is provided between the P-side electrode 13 and the P-type clad layer 11, and at least one of the active layer 9 and the passive layer 10 is provided with separated confinement heterostructure (SCH) sandwiching these layers in the vertical direction (Z-direction), illustration of these components is eliminated.

Figure 3B:
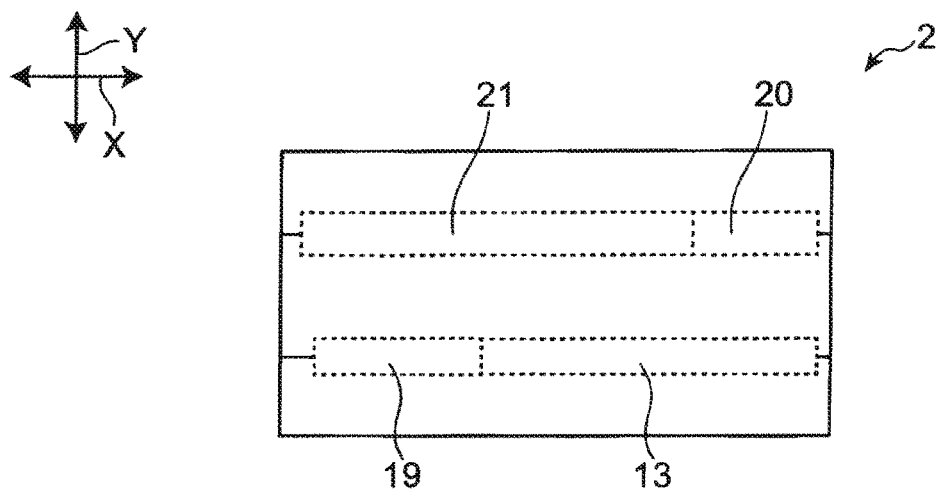
FIG. 3B is a perspective view of a waveguide of the first semiconductor chip illustrated in FIG. 3A viewed from its bottom surface side.

FIG. 3A is a plan view illustrating the first semiconductor chip 2. FIG. 3B is a perspective view of the first semiconductor chip 2 vertically inverted around a reverse axis R illustrated in FIG. 3A and viewed from its bottom side. In FIG. 3B, the P-side electrode 13, the N-side electrode 14 and the heater electrode 15 are not illustrated.

As illustrated, the first and second waveguides 16, 17 each have a stripe shape extending in the longitudinal direction (X-direction). The first and second waveguides 16, 17 are disposed in parallel with each other at a predetermined distance in the width direction (Y-direction). The distance between the first waveguide 16 and the second waveguide 17 is preferably about 200 microns or more to suppress thermal crosstalk. The distance between the first waveguide 16 and the second waveguide 17 may be about 300 microns or less to reduce a chip size of the first semiconductor chip 2 while the thermal crosstalk is preferably suppressed.

Each of the first and second waveguides 16, 17 has at least two of a gain region, a reflection grating region, and a phase region. When forward bias voltage is applied between the P-side electrode 13 and the N-side electrode 14 in the gain region, a current is injected into the active layer 9 to amplify light generated, and thus the gain region may be also referred to as an optical gain region. The reflection grating region functions as a reflection mirror for reflecting light traveling in the first and second waveguides 16, 17, and coupling the light to the second semiconductor chip 3 side. In the phase region, an oscillation wavelength of the variable wavelength laser device 1 is adjusted.

In the present embodiment, the first waveguide 16 is provided with a gain region 18 and a first reflection grating region 19. The second waveguide 17 is provided with a phase region 20 and a second reflection grating region 21. In the first waveguide 16, another phase region may be provided on an opposite side of the first reflection grating region 19 with the gain region 18 interposed therebetween.

The P-side electrode 13 described above is provided on the gain region 18. The gain region 18 is a region for amplifying light generated by a current injected into the active layer 9 when a forward bias voltage is applied between the P-side electrode 13 and the N-side electrode 14, and may be also referred to as an optical gain region. The heater electrode 15 described above is provided in the phase region 20. A thin film heater 22 is provided between the heater electrodes 15, 15. The first reflection grating region 19 also includes a heater electrode 23 and a thin film heater 24 provided between the heater electrodes 23, 23, and the second reflection grating region 21 also includes a heater electrode 25 and a thin film heater 26 provided between the heater electrodes 25, 25.

When the thin film heaters 2, 24, 26 are heated using the heater electrodes 15, 23, 25, respectively, temperature of passive layers 10, 27 (refer to FIG. 4 for the passive layer 27) positioned therebelow is increased to change their refractive indexes, and then an oscillation wavelength of the variable wavelength laser device 1 changes. The thin film heaters 24, 26 provided in the first and second reflection grating regions 19, 21, respectively, are used to roughly adjust the oscillation wavelength of the variable wavelength laser device 1, and the thin film heater 22 provided in the phase region 20 is used to finely adjust the oscillation wavelength of the variable wavelength laser device 1.

The P-side electrode 13 and the heater electrodes 15, 23, 25 are provided with respective upper surfaces flush with each other. These front surface electrodes provided on the first semiconductor chip 2 are bonded to the second semiconductor chip 3 by flip chip bonding by vertically inverting the first semiconductor chip 2 as described above.

In the first and second reflective grating regions 19 and 21, a spatially modulated vernier grating such as a sampled grating (SG) or a super periodic structure grating (SSG) is formed in an upper surface of the passive layer 10 or a region near the upper surface (e.g., a position downward from the upper surface of the passive layer 10 by about 100 nm or more and about 150 nm or less), along a waveguide direction of light. The first and second reflection grating regions 19 and 21 are slightly different from each other in a modulation cycle of the grating.

An anti-reflection (AR) coating (not illustrated) is applied to each of chip end surfaces (YZ-plane and ZX-plane) perpendicular to the first and second waveguides 16, 17, and a chip upper surface (XY-plane).

Figure 4:
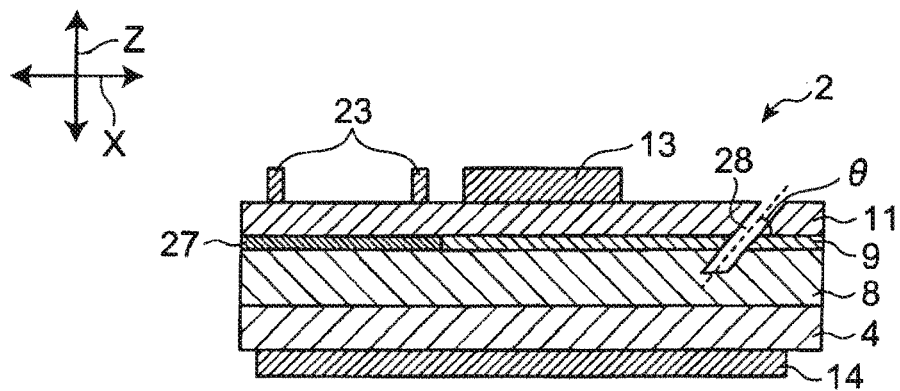
FIG. 4 is a cross-sectional view of FIG. 3A taken along line C-C and viewed in a direction of each arrow.

FIG. 4 is a cross-sectional view of FIG. 3A taken along line C-C and viewed in a direction of each arrow. In FIG. 4, the gratings provided in the first and second reflection grating regions 19 and the thin film heater 24 are not illustrated. As illustrated, the passive layer 10 provided in the second waveguide 17 illustrated in FIG. 2 extends to the first reflection grating region 19 of the second waveguide 17 (a passive layer positioned in the first reflection grating region 19 of the second waveguide 17 is designated by a reference sign 27). Although not illustrated, the second reflection grating region 21 of the second waveguide 17 is provided with the passive layer 10 continued from the phase region 20. The active layer 9 provided in the gain region 18 and the passive layer 27 provided in the first reflection grating region 19 are bonded using a known regrowth technique called butt joint growth.

The gain region 18 provided in the first waveguide 15 has an end in the longitudinal direction (X-direction) formed with a groove 28. The groove 28 extends inclined at a predetermined angle θ from the height direction (Z-direction) toward the longitudinal direction (X-direction) in which the waveguide 16 extends, i.e., a traveling direction of light. The predetermined angle θ is preferably 40 degrees or more and 50 degrees or less, and most preferably 45 degrees. The groove 28 has a surface functioning as a reflection mirror for light traveling in the vertical direction (Z-direction) between the first semiconductor chip 2 and the second semiconductor chip 3. The groove 28 can be provided by covering a region excluding an opening with a mask and performing etching treatment. To form the groove 28 extending in the direction described above, it is preferable to use a dry etching method capable of setting an angle, such as reactive ion etching (RIE).

As illustrated in FIG. 1A, the groove 28 is provided at least partially overlapping with a grating coupler 35 provided in the second semiconductor chip 3 in the longitudinal direction (X-direction) when viewed from the width direction (Y-direction). The inclination angle θ of the groove 28 described above has a preferable value that may vary depending on an oscillation wavelength of the variable wavelength laser device 1 and a structure of the grating coupler 35.

In the vicinity of the groove 28, a spot size conversion structure (not illustrated) for increasing a width of the first waveguide 16 may be provided to reduce coupling loss between the first waveguide 16 and the grating coupler 35. Furthermore, a structure for forming a light beam emitted from the first waveguide 16 in a circular shape may be provided.

Although not illustrated, a groove similar to the groove 28 described above is also provided at an end in the longitudinal direction (X-direction) of the phase region 20 provided in the second waveguide 17 except the heater electrode 15 and the thin film heater 22.

[3. Second Semiconductor Chip]

Figure 5A:
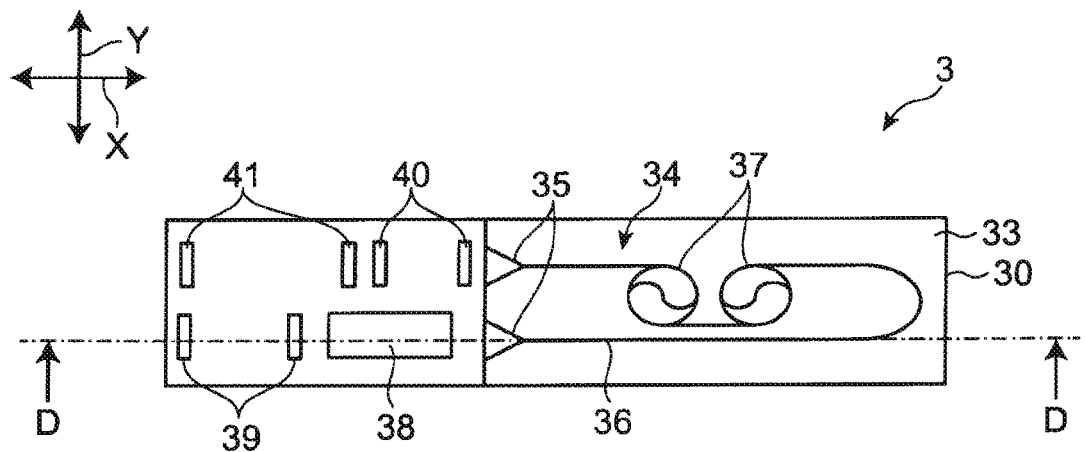
FIG. 5A is a plan view illustrating a second semiconductor chip.
Figure 5B:
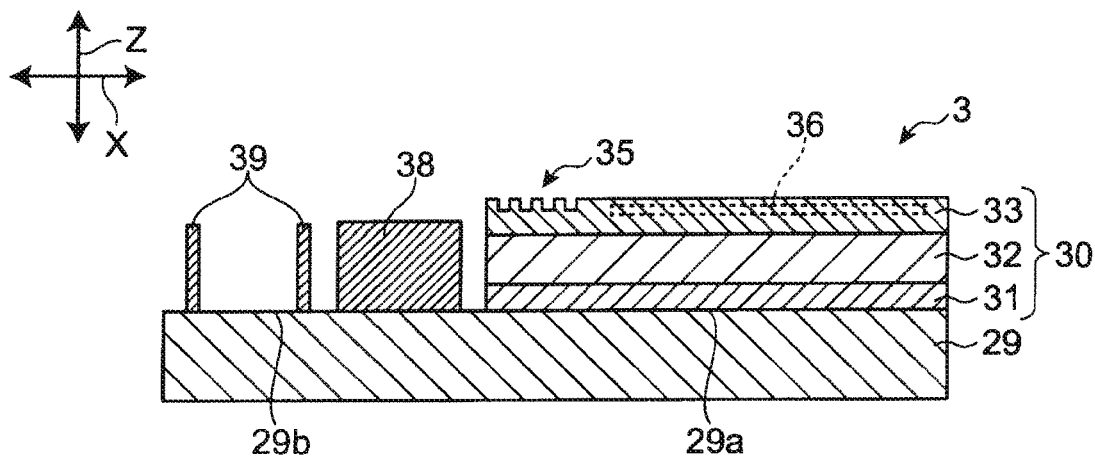
FIG. 5B is a cross-sectional view of FIG. 5A taken along line D-D and viewed in a direction of each arrow.

FIG. 5A is a plan view illustrating the second semiconductor chip 3, and FIG. 5B is a cross-sectional view of FIG. 5A taken along line D-D and viewed in a direction of each arrow. Hereinafter, an example in which the second semiconductor chip 3 is made of a silicon-based material will be described.

The second semiconductor chip 3 includes a silicon substrate 29. The silicon substrate 29 is provided on its upper surface with a non-exposed region 29a and an exposed region 29b.

A laminate 30 is provided on the non-exposed region 29a of the silicon substrate 29. The laminate 30 includes a silicon layer 31, a silicon oxide film layer 32 provided on the silicon layer 31, and a silicon layer 33 provided on the silicon oxide film layer 32. A protective film made of silicon oxide may be provided on the silicon layer 33.

The silicon layer 33 being the uppermost layer of the laminate 30 is provided with an optical circuit 34. The optical circuit 34 includes two grating couplers 35, 35 having the same number of waveguides 16, 17 provided in the first semiconductor chip 2, a single mode waveguide 36 connecting between the grating couplers 35, 35, and a spiral portion 37 provided in a path of the single mode waveguide 36. The grating coupler 35 has a grating for achieving periodic refractive index modulation, and is configured to couple light emitted from the first and second waveguides 16, 17 of the first semiconductor chip 2 with high efficiency. Accordingly, the optical circuit 34 is optically connected to the first and second waveguides 16, 17, and cooperates with the first and second waveguides 16, 17 to constitute a resonator. That is, the optical circuit 34 optically connects the first waveguide 16 and the second waveguide 17.

The grating coupler 35 has a diameter similar to a mode diameter of the optical fiber (first and second waveguides 16, 17), and can be expanded according to the mode diameter. Accordingly, even when the first semiconductor chip 2 and the second semiconductor chip 3 are aligned for bonding with accuracy on the order of microns, loss of optical coupling can be reduced. The grating coupler 35 has an exemplary size of about 10 μm by about 10 μm. The grating couplers 35, 35 are disposed in parallel with each other at a predetermined distance in the width direction (Y-direction). To optically couple the first semiconductor chip 2 and the second semiconductor chip 3, the predetermined distance is preferably set similar to a distance between the first and second waveguides 16, 17 in the width direction (Y-direction) to enable alignment at two or more places to be performed collectively by flip chip bonding.

When the first semiconductor chip 2 and the second semiconductor chip 3 are bonded, the first semiconductor chip 2 and the grating coupler 35 are separated from each other in the vertical direction (Z-direction) by a predetermined distance. The predetermined distance has an exemplary value of about 10 μm. The first semiconductor chip 2 and the grating coupler 35 may be in direct contact with each other.

The spiral portion 37 has a function of spirally winding the waveguide to increase an optical path length. The spiral portion 37 may be an S-bend spiral described in the Laser Photonics Review (Vol. 8, No. 5, 2014, pp 667-686), for example.

As illustrated in FIG. 5A, power supply electrodes 38, 39, 40, 41 (a plurality of electrodes) are provided on the exposed region 29b of the silicon substrate 29. The power supply electrodes 38, 39, 40, 41 are directly bonded to respective electrodes provided on the first semiconductor chip 2, and have a function of supplying power to the corresponding electrodes. Specifically, the power supply electrode 38 is configured to supply power to the P-side electrode 13. The power supply electrodes 39, 40, 41 are configured to supply power to the heater electrodes 23, 15, 25, respectively. The power supply electrodes 39, 40, 41 are provided with respective upper surfaces flush with each other.

[4. Operation of Variable Wavelength Laser Device]

Next, with reference to FIGS. 6A and 6B, operation of the variable wavelength laser device 1 according to the first embodiment of the present invention will be described.

When forward bias voltage is applied between the P-side electrode 13 and the N-side electrode 14, electrons and holes are injected and excited in the active layer 9. As a result, an optical gain is generated, and light emission generated by carrier recombination is amplified.

In the first waveguide 16, the active layer 9 provided in the gain region 18 and the passive layer 27 provided in the first reflection grating region 19 are bonded to each other by butt joint growth to form the waveguide (the first waveguide 16). A part of guided light emitted from the gain region 18 travels to the left in FIGS. 6A, 6B, and is reflected by the first reflection grating region 19 to travel to the right. Meanwhile, the light having passed through the first reflection grating region 19 without being reflected is emitted from the passive layer 27 as a first light output 42.

Figure 6A:
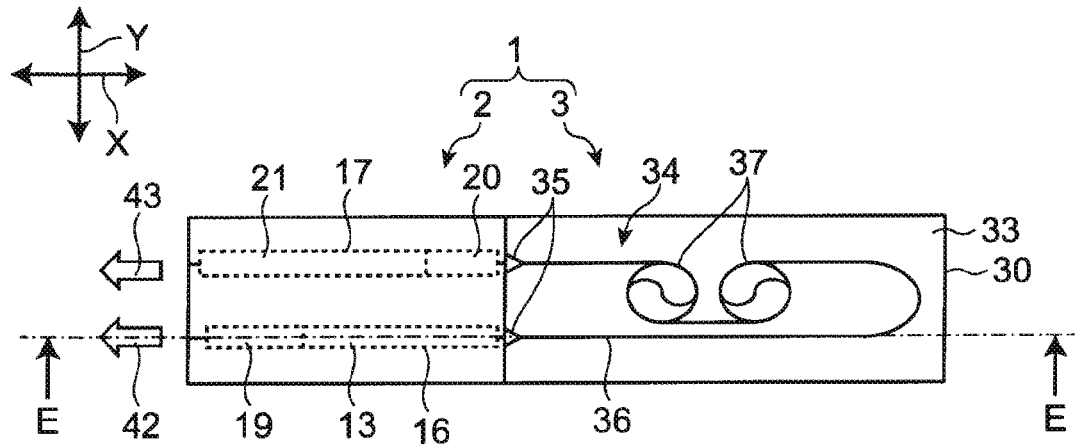
FIG. 6A is a plan view illustrating behavior of light when the variable wavelength laser device according to the first embodiment of the present invention is operated.
Figure 6B:
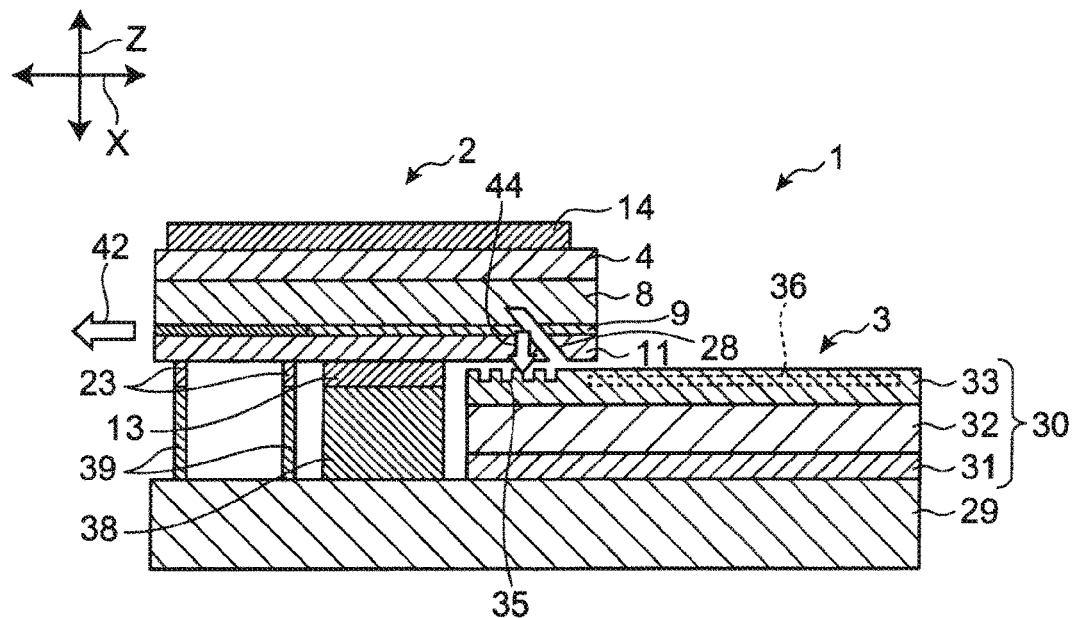
FIG. 6B is a cross-sectional view of FIG. 6A taken along line E-E and viewed in a direction of each arrow.

The guided light traveling to the right of FIGS. 6A, 6B is reflected on the surface of the groove 28, functioning as a reflection mirror, and is optically coupled, as reflected light 44, to one of the grating couplers 35, 35 provided in the second semiconductor chip 3. Then, the light travels through the optical circuit 34 provided in the second semiconductor chip 3, and reaches the other of the grating couplers 35, 35 to be emitted toward the first semiconductor chip 2 above as a light beam that is not illustrated. The light beam traveling upward is reflected on a surface of a groove (not illustrated) positioned near an end of the phase region 20, and reaches the phase region 20 and the second reflection grating region 21. Then, the light travels to the left through the optical circuit 34. A part of the guided light is reflected on the second reflective grating region 21 and travels to the right, following a path opposite to the path described above, and the residual of the guided light (i.e., light having passed through the second reflective grating region 21) is emitted as a second light output 43. As described above, the first and second light outputs 42, 43 are extracted to the outside from the first semiconductor chip side (left side in the drawing) in the longitudinal direction (X-direction).

The first and second light outputs 42, 43 each can be used as input light to an external light modulator and light for wavelength monitoring, and can be easily connected to the light modulator by a cascade connection. The light modulator may be a Mach-Zehnder (MZ) modulator for phase modulation having a LiNbO3 (LN) structure utilizing refractive index change due to Pockels effect or a semiconductor multiple quantum well structure utilizing refractive index change due to quantum-confined Stark effect. An intensity ratio of the first light output 42 to the second light output 43 is determined by a ratio of mode reflectance of the first reflective grating region 19 to mode reflectance of the second reflective grating region 21.

Laser oscillation operation of the variable wavelength laser device 1 is achieved when an optical gain generated in the active layer 9 of the first semiconductor chip 2 is balanced with the sum of absorption loss and resonator loss.

As described above, in the variable wavelength laser device 1, the first and second waveguides 16, 17 provided in the first semiconductor chip 2 and the optical circuit 34 provided in the second semiconductor chip 3 constitute the resonator. As a result, in the variable wavelength laser device 1, the resonator length is increased to easily achieve narrow line width operation, compared to a resonator composed of the first semiconductor chip 2 alone. For example, when the number of spiral portions 37 is increased in the optical circuit 34, the resonator length can be easily increased while a small chip size in maintained (e.g., 1 cm by 1 cm). The resonator length can be several centimeters or more, for example. The resonator length is larger by one unit than that when a resonator is composed of the first semiconductor chip 2 alone, and similar to that of a typical external cavity laser diode.

[5. Oscillation Wavelength of Variable Wavelength Laser Device]

Next, with reference to FIGS. 7 to 11, the adjustment principle of an oscillation wavelength of the variable wavelength laser device 1 will be described. While an example in which a sampled grating (SG) is provided in each of the first and second reflection grating regions 19, 21 is described in the description below, it is understood by those skilled in the art that an oscillation wavelength is similarly adjusted even in an example in which a super structure grating (SSG) is provided in each of the first and second reflection grating regions 19, 21.

Figure 7:
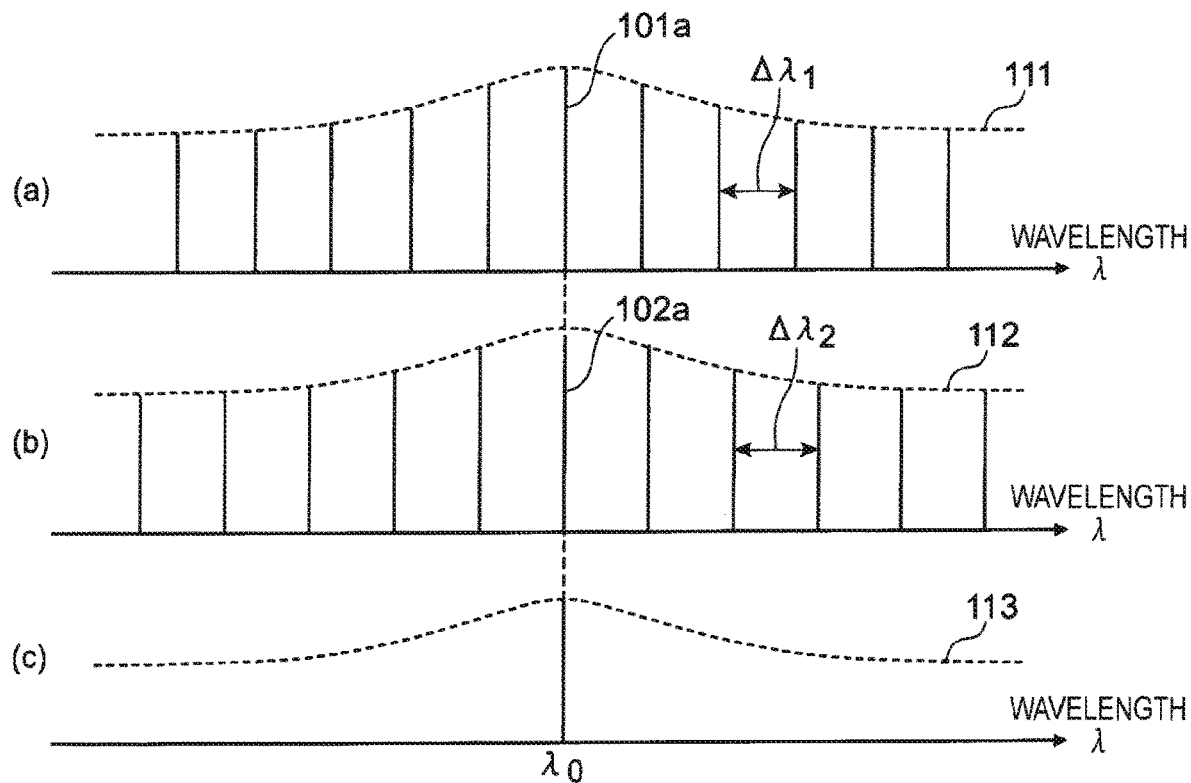
FIG. 7 is a diagram for illustrating an oscillation wavelength of the variable wavelength laser device in an initial state.

FIG. 7 is a diagram for illustrating an oscillation wavelength of the variable wavelength laser device 1 in an initial state. The initial state refers to a state before the passive layers 10, 27 are heated. A reflection spectrum in the first reflection grating region 19 is illustrated in the portion (a), a reflection spectrum in the second reflection grating region 21 is illustrated in the portion (b), and an oscillation spectrum of the variable wavelength laser device 1 is illustrated in the portion (c). The same applies to FIGS. 8 to 11.

In each of the reflection spectra illustrated in the portions (a), (b) of FIG. 7, a plurality of reflection peaks is present in left-right symmetry across zero-order peaks 101a, 102a. A wavelength interval at the reflection peaks is given as $\lambda^2/(2 \times n_g \times Li)$ with respect to wavelength $\lambda$, using a modulation period Li (i=1, 2) of a vernier diffraction grating provided in each of the first and second reflection grating regions 19, 21, and a group refractive index $n_g$ of a resonator. As described above, the first and second reflection grating regions 19, 21 are different from each other in a value of the modulation period Li, and thus have wavelength intervals different from each other. In FIGS. 8 to 11, the wavelength interval of the first reflection grating region 19 is indicated as $\Delta\lambda_1$, and the wavelength interval of the second reflection grating region 21 is indicated as $\Delta\lambda_2$. The wavelength intervals $\Delta\lambda_1$, $\Delta\lambda_2$ each have a typical value of from 4 nm to 5 nm. The reflection peak typically has a wavelength width of from 1 nm to 2 nm. In the examples illustrated in FIGS. 7 to 11, it is designed to realize the shapes of the reflection spectra illustrated in the portions (a), (b) of FIG. 7 throughout a wavelength width of from 30 nm to 50 nm.

Envelopes 111, 112 of the reflection spectra illustrated in the portions (a), (b) of FIG. 7, respectively, are each given in the shape of a sampling function, sin (x)/x. Intensity of the reflection peaks decreases gradually on both sides across each of the central zero-order peaks 101a, 102a.

In the initial state illustrated in FIG. 7, the reflection spectra of the first and second reflection grating regions 19, 21 overlap with each other only in the zero-order peaks 101a, 102a in a multiplicative manner. In this state, the heater electrode 15 provided in the phase region 20 is energized to heat the passive layer 10, and then a wavelength position in a longitudinal mode is finely adjusted to obtain $\lambda_0$ illustrated, as an oscillation wavelength of the variable wavelength laser device 1.

FIGS. 8 to 11 each illustrate an oscillation wavelength of the variable wavelength laser device when the passive layers 10, 27 are heated.

First, an example in which the thin film heater 24 of a first vernier-type DBR 19 is energized to heat the passive layer 27 will be described. When the passive layer 27 is heated, the envelope 111 of the reflection spectrum is shifted by $\partial\lambda$ to a long wavelength side (the right in the drawing) as a whole, as illustrated in the portion (a) of FIG. 8. As a result, a reflection peak 102b of the second reflection grating region 21 aligns with a reflection peak 101b adjacent to the zero-order peak 101a on the long wavelength side. In this state, when the wavelength position of the longitudinal mode is finely adjusted by the above-described method, $\lambda_1$ illustrated in the drawing is obtained as an oscillation wavelength of the variable wavelength laser device 1.

Figure 8:
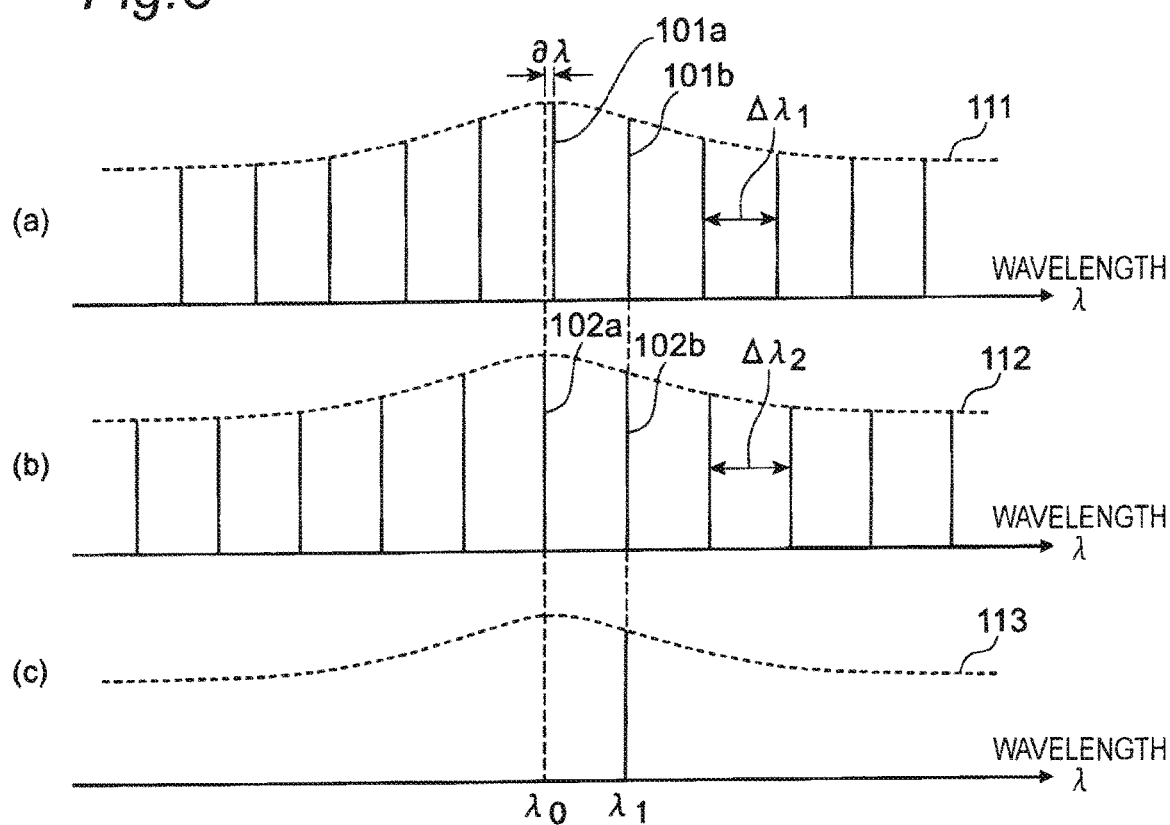
FIG. 8 is a diagram for illustrating a method of adjusting an oscillation wavelength of the variable wavelength laser device.
Figure 9:
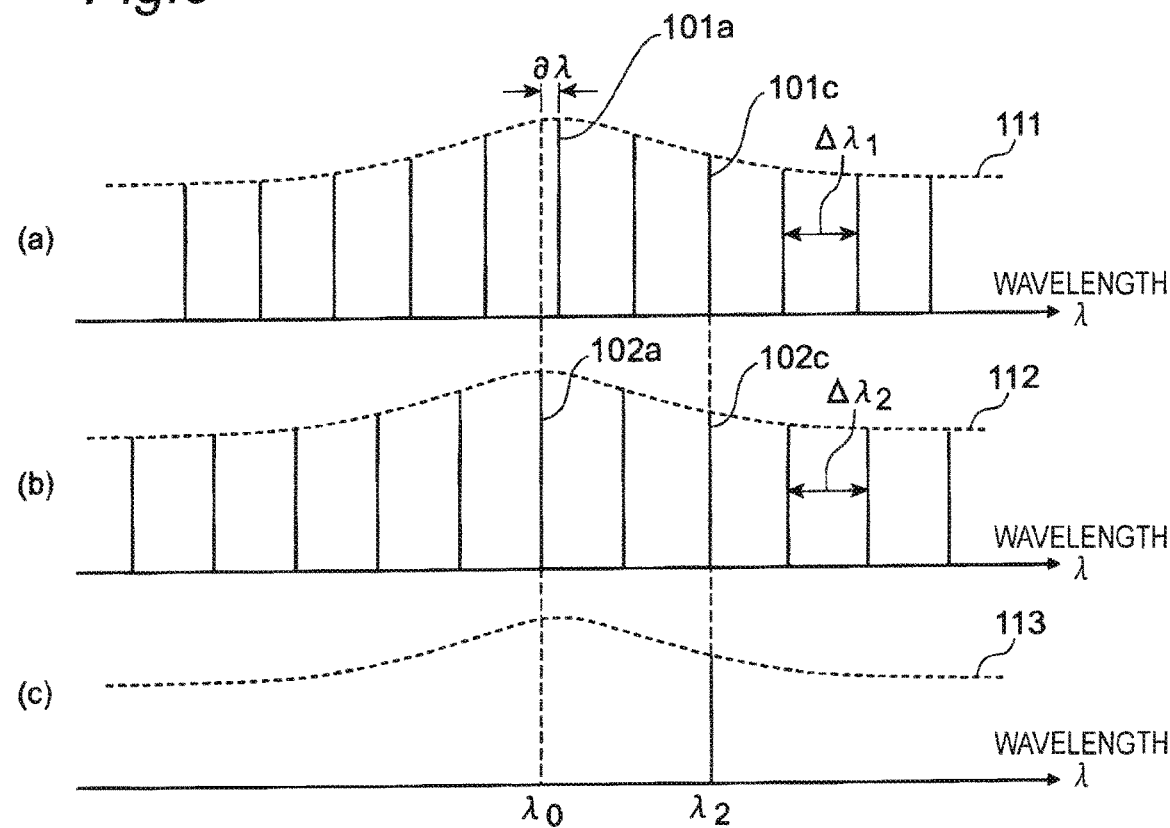
FIG. 9 is a diagram for illustrating a method of adjusting an oscillation wavelength of the variable wavelength laser device.

When the amount of energization of the thin film heater 24 of the first vernier type DBR 19 is increased to further heat the passive layer 27, the shift amount $\partial\lambda$ is increased to more than that in the portion (a) of FIG. 8, as illustrated in the portion (a) of FIG. 9. As a result, a reflection peak 102c of the second reflection grating region 21 aligns with a reflection peak 101c on the long wavelength side with respect to the zero-order peak 101a. Then, when the wavelength position of the longitudinal mode is finely adjusted by the above-described method, $\lambda_2$ illustrated in the drawing is obtained as an oscillation wavelength of the variable wavelength laser device 1.

Next, an example in which the thin film heater 26 of a second vernier-type DBR 21 is energized to heat the passive layer 10 will be described. When the passive layer 10 is heated, the envelope 112 of the reflection spectrum is shifted by $\partial\lambda$ to the long wavelength side (the right in the drawing) as a whole, as illustrated in the portion (a) of FIG. 10. As a result, a reflection peak 101d of the first reflection grating region 19 aligns with a reflection peak 102d adjacent to the zero-order peak 102a on a short wavelength side. In this state, when the wavelength position of the longitudinal mode is finely adjusted by the above-described method, $\lambda_{-1}$ illustrated in the drawing is obtained as an oscillation wavelength of the variable wavelength laser device 1.

Figure 10:
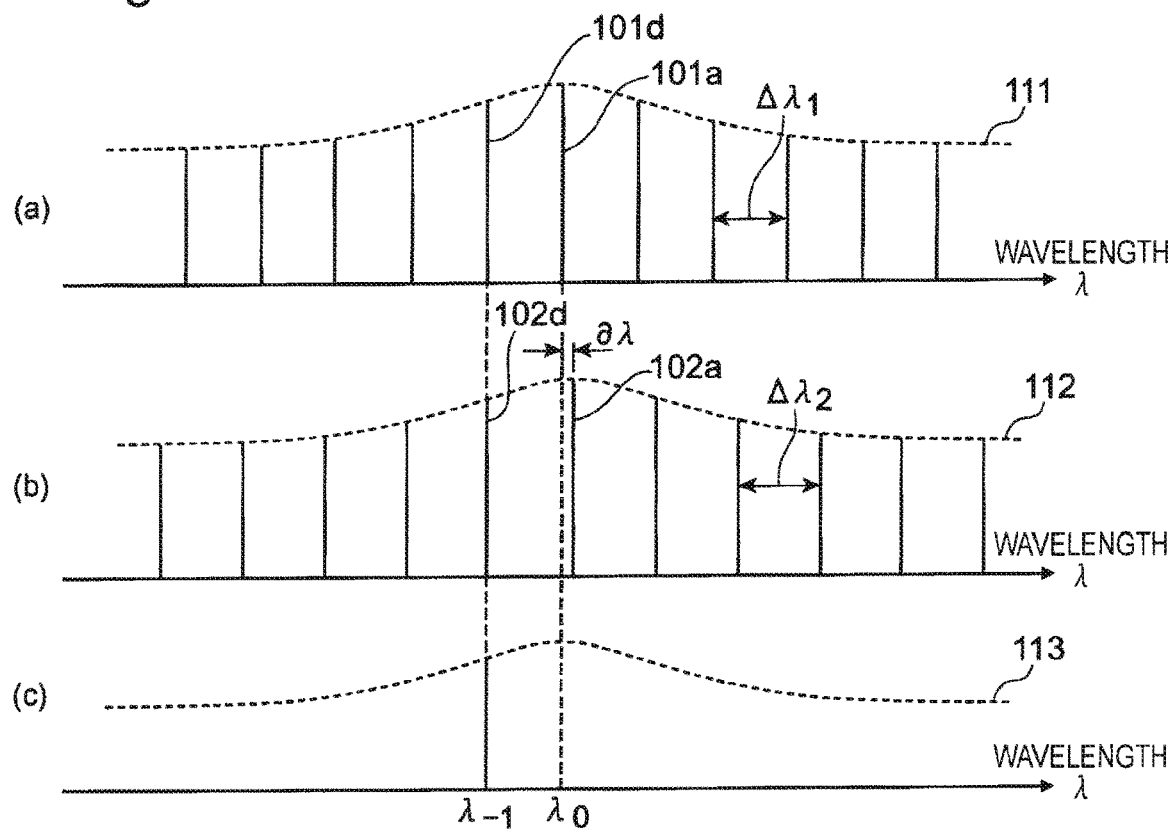
FIG. 10 is a diagram for illustrating a method of adjusting an oscillation wavelength of the variable wavelength laser device.
Figure 11:
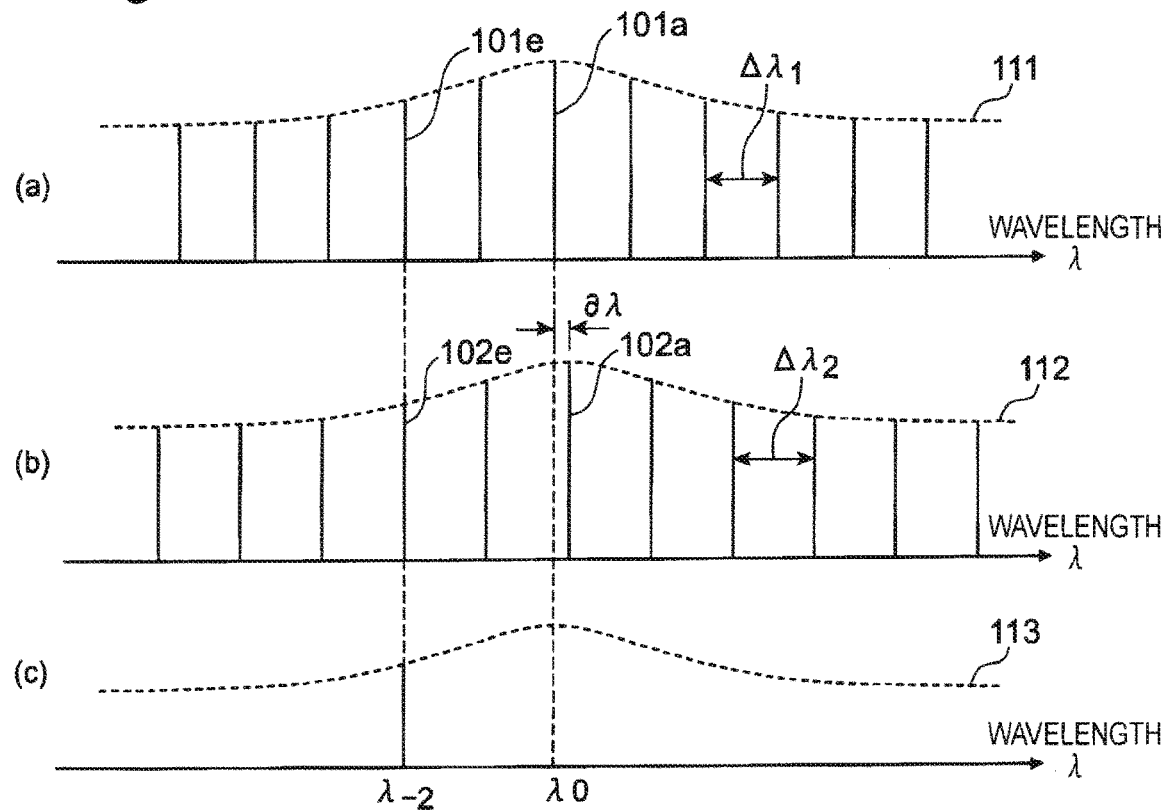
FIG. 11 is a diagram for illustrating a method of adjusting an oscillation wavelength of the variable wavelength laser device.

When the amount of energization of the thin film heater 26 of the second vernier type DBR 21 is increased to further heat the passive layer 10, the shift amount $\partial\lambda$ is increased to more than that in the portion (a) of FIG. 10, as illustrated in the portion (a) of FIG. 11. As a result, a reflection peak 101e of the first reflection grating region 19 aligns with a reflection peak 102e on the short wavelength side with respect to the zero-order peak 102a. Then, when the wavelength position of the longitudinal mode is finely adjusted by the above-described method, $\lambda_{-2}$ illustrated in the drawing is obtained as an oscillation wavelength of the variable wavelength laser device 1.

The shift amount ∂λ of a wavelength due to heating has a maximum value designed to be approximately equal to a reflection peak interval, whereby any reflection peak can be selected. When the first and second reflection grating regions 19, 21 are simultaneously heated, the wavelength can be swept while the reflection peaks are aligned with each other. Accordingly, in cooperation with the heating of the passive layer 10 in the phase region 20, pseudo continuous wavelength variable operation can be performed throughout a wavelength width of from 30 nm to 50 nm.

[6. Variable Wavelength Laser Device Production Method]

Figure 12:
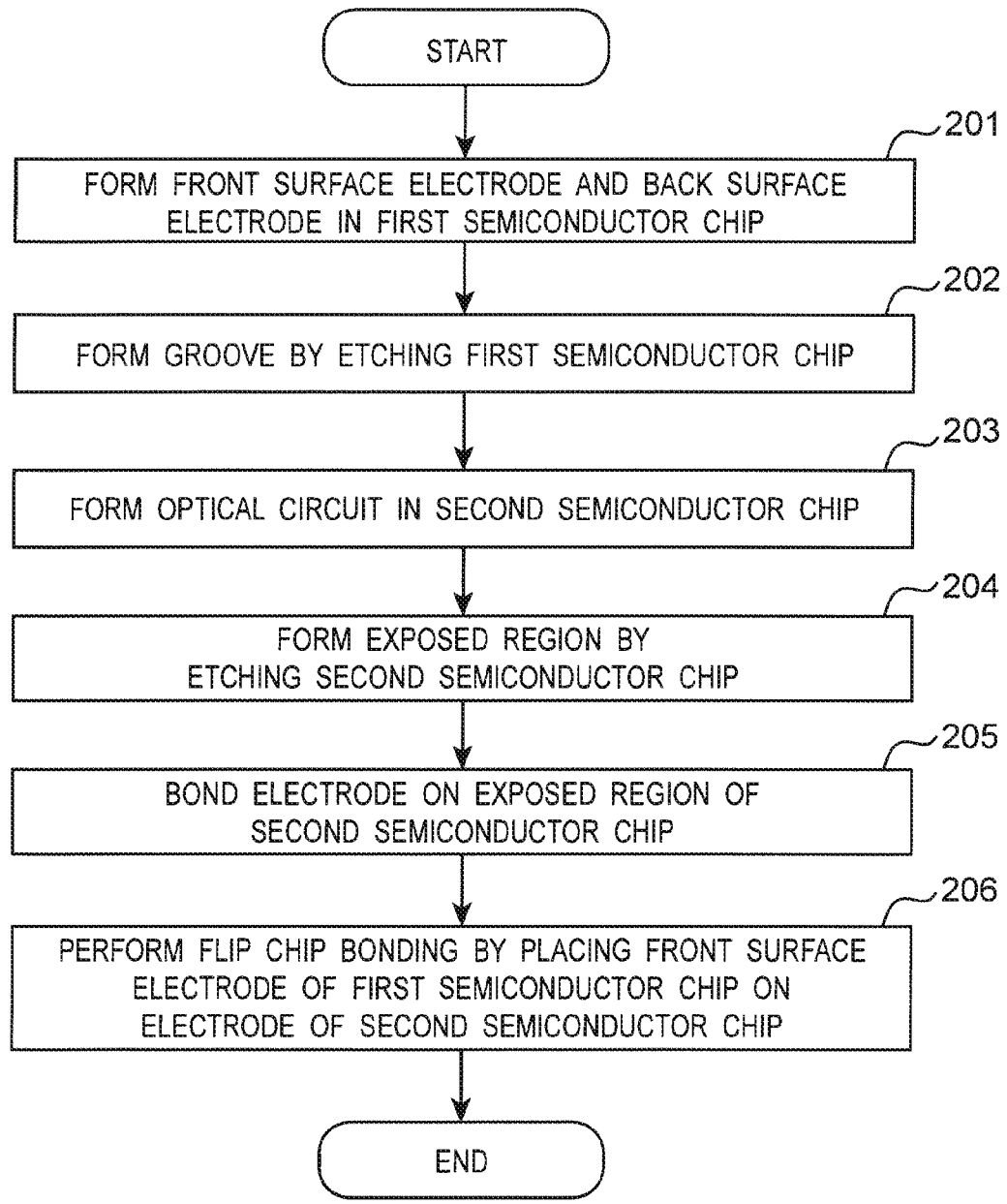
FIG. 12 is a flow chart illustrating an exemplary production method of the variable wavelength laser device according to the first embodiment of the present invention.

FIG. 12 is a flow chart illustrating an exemplary production method of the variable wavelength laser device 1 according to the first embodiment of the present invention. The production method includes the steps of preparing the first semiconductor chip 2, preparing the second semiconductor chip 3, and bonding the first semiconductor chip 2 and the second semiconductor chip 3.

In the step of preparing the first semiconductor chip 2, the P-side electrode 13 being a front electrode, the heater electrodes 15, 23, 25, and the N-side electrode 14 being a back surface electrode, are formed in the first semiconductor chip 2 with the waveguides 16, 17 provided on the N-type substrate 4 (step 201). Next, the first semiconductor chip 2 is etched to form the groove 28 (step 202).

Figure 13A:
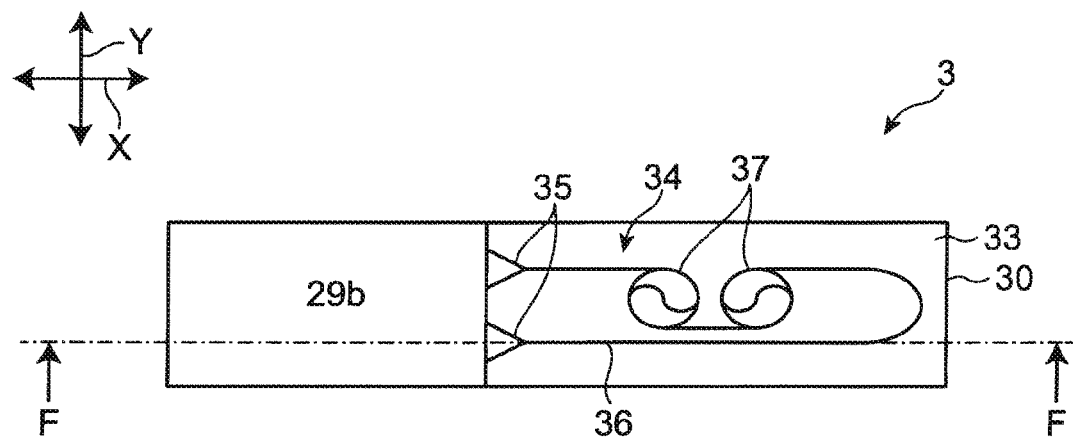
FIG. 13A is a plan view illustrating a manufacturing step of the second semiconductor chip.
Figure 13B:
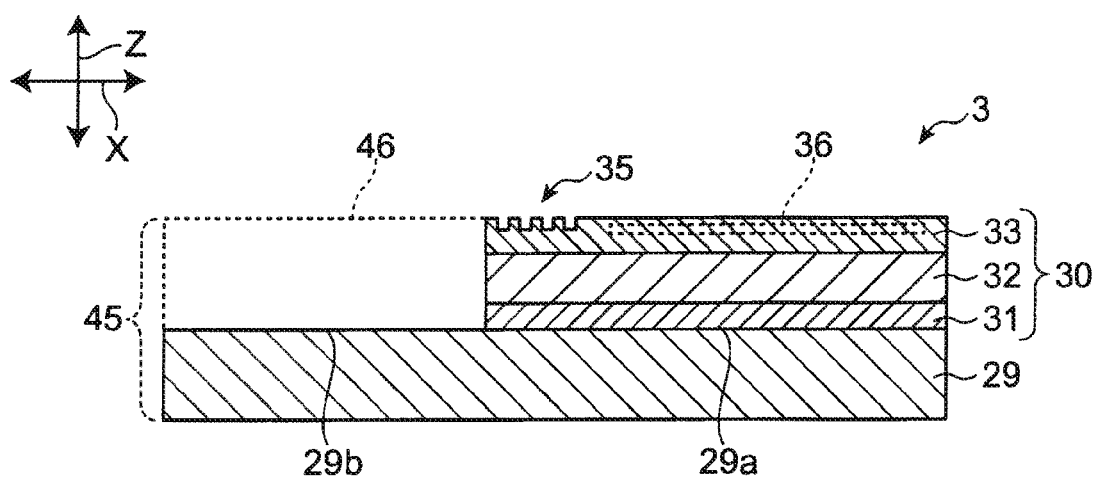
FIG. 13B is a cross-sectional view of FIG. 13A taken along line F-F and viewed in a direction of each arrow.

As illustrated in FIGS. 13A, 13B, in the step of preparing the second semiconductor chip 3, a silicon-on-insulator (SOI) substrate in which a silicon substrate, a silicon oxide film layer, and a silicon layer are layered in this order is prepared by a known method. The uppermost silicon layer 33 is formed with the optical circuit 34 (step 203).

The optical circuit 34 of the second semiconductor chip 3 can be manufactured using a process compatible with a complementary metal-oxide-semiconductor (CMOS) process using a typical component in a foundry of silicon photonics.

Next, the SOI substrate is etched to remove a part of the silicon layer below the silicon oxide film layer (step 204). In FIG. 13B, a portion removed by etching in the SOI substrate is designated by reference numeral 46. Accordingly, the non-exposed region 29a and the exposed region 29b are formed on the silicon substrate 29, and the laminate 30 including the silicon layer 31, the silicon oxide film layer 32, and the silicon layer 33, is provided on the non-exposed region 29a. Subsequently, the power supply electrodes 38, 40, 39, and 41 are bonded onto the exposed area 29b of the second semiconductor chip 3 (step 205).

In the step of bonding the first semiconductor chip 2 and the second semiconductor chip 3, first, a bump of conductive bonding material such as solder is placed on the power supply electrodes 38, 40, 39, 41 provided on the exposed region 29b of the second semiconductor chip 3. Then, while the first semiconductor chip 2 is inverted and held using a bonding head of a flip chip bonder (not illustrated), the P-side electrode 13, the heater electrodes 15, 23, 25, and the power supply electrodes 38, 40, 39, 41 are aligned, and then the bump is heated to about 350° C., for example, to be melted. With the bump melted, the first semiconductor chip 2 is lowered to bond the P-side electrode 13, and the heater electrodes 15, 23, 25, to the corresponding power supply electrodes 38, 40, 39, 41 (step 205). Accordingly, the first and second waveguides 16, 17 provided in the first semiconductor chip 2 are optically connected to the optical circuit 34. The variable wavelength laser device 1 in the manufactured state is as illustrated in FIGS. 1A, 1B.

Second Embodiment

Figure 14:
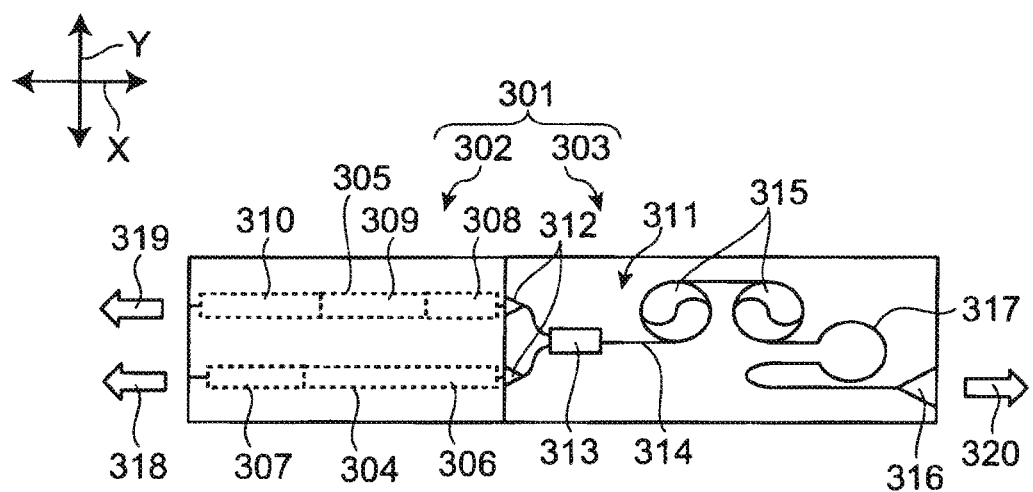
FIG. 14 is a plan view illustrating behavior of light when the variable wavelength laser device according to a second embodiment of the present invention is operated.

FIG. 14 is a cross-sectional view illustrating variable wavelength laser device 301 according to a second embodiment of the present invention. Hereinafter, only portions in the configuration of the variable wavelength laser device 301, different from those in the variable wavelength laser device 1 according to the first embodiment, will be described.

The variable wavelength laser device 301 includes a first semiconductor chip 302 and a second semiconductor chip 303. The first semiconductor chip 302 includes a first waveguide 304 and a second waveguide 305. The first waveguide 304 is provided with a first gain region 306 and a first reflection grating region 307. The second waveguide 305 is provided with a phase region 308, a second gain region 309, and a second reflection grating region 310. As described above, the variable wavelength laser device 301 includes the first waveguide 304 and the second waveguide 305 each of which is provided with the gain region.

The second semiconductor chip 303 is provided with an optical circuit 311 corresponding to the optical circuit 34 illustrated in FIG. 1A and the like. The optical circuit 311 includes two grating couplers 312 having the same number of waveguides 304, 305 provided in the first semiconductor chip 302, a multimode interference (MMI) coupler 313 having light input-output ports connected to the respective grating couplers 312, 312 via a single mode waveguide 314, a spiral portion 315 provided in a path of the single mode waveguide 314, and a further (third) grating coupler 316. A loop mirror 317 is provided between the MMI coupler 313 and the grating coupler 316. The first and second grating couplers 312, 312 provided at one end of the second semiconductor chip 303 in the longitudinal direction (X-direction) are provided to realize optical coupling with the first semiconductor chip 302. The third grating coupler 316 is provided at the other end thereof to extract light output.

In the variable wavelength laser device 301, a resonator is formed in parallel between the reflection grating regions 307, 310 of the corresponding first and second waveguides 304, 305, and the loop mirror 317, and an oscillation wavelength is adjusted according to the principle similar to that in the variable wavelength laser device 1 illustrated in FIGS. 1A, 1B, and the like. Each of first and second light outputs 318, 319 extracted to the outside from a first semiconductor chip side (the left in the drawing) in the longitudinal direction (X-direction) can be used as input light to an external light modulator and light for monitoring a wavelength, and a third light output 320 extracted from the third grating coupler 316 to the outside from a second semiconductor chip side (the right in the drawing) in the longitudinal direction (X-direction) also can be used as input light to the external light modulator or the like.

[Modification]

As described above, while the plurality of embodiments is described for the present invention, the feature described in each of the embodiments may be combined freely. In addition, various improvements, design changes, and deletions may be added to the above-described embodiments, and various modifications exist for the present invention.

For example, in the embodiments described above, the N-type substrate 4, the N-type clad layer 8 provided on the N-type substrate 4, and the P-type clad layers 11, 12 provided above the N-type clad layer 8 are used. The present invention is not limited to this, and all the conductivity types are reversed, and a P-type substrate, an N-type clad layer provided on the P-type substrate, and an N-type clad layer provided above the P-type clad layer, may be used.

In the embodiments described above, an oscillation wavelength of the variable wavelength laser device 1 (301) is changed by heating the passive layers 10, 27 to change refractive indexes thereof. The present invention is not limited to this, and each of the refractive indexes may be changed by performing current injection to the passive layers 10 and 27.

Figure 15:
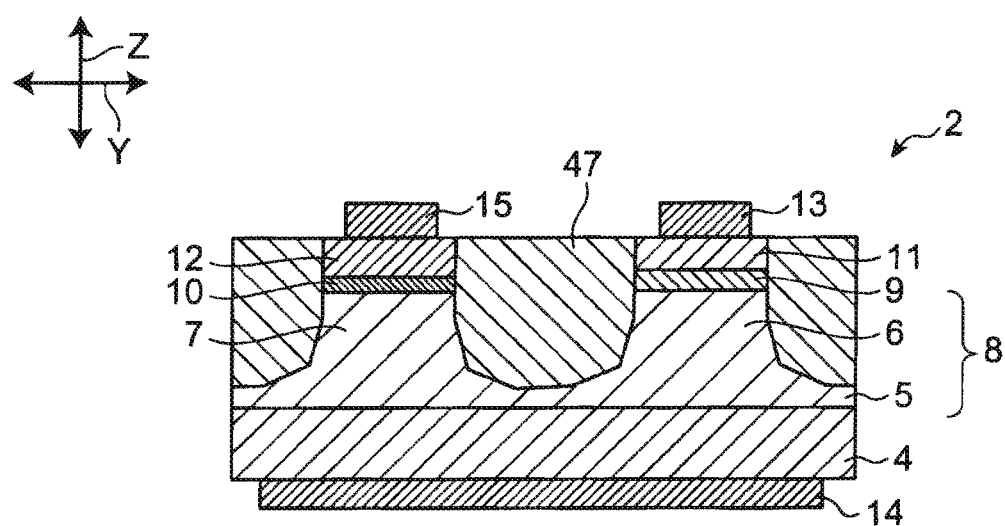
FIG. 15 is a cross-sectional view illustrating a modification of the first semiconductor chip.

In the embodiments described above, the first and second waveguides 16, 17 (304, 305) provided in the first semiconductor chip 2 (302) are each a so-called ridge type. The present invention is not limited to this, and the plurality of waveguides provided in the first semiconductor chip 2 (302) may be a so-called embedded type illustrated in FIG. 15. In the embedded type waveguide, a high resistance region 47 is provided on the flat portion 5 of the N-type clad layer 8 and at a position adjacent to the ridge portion 6. The high resistance region 47 may be made of material such as Fe (iron)-doped InP layer exhibiting a semi-insulating property, or (P—N—P) InP functioning as a current blocking layer.

In the embodiments described above, the N-type substrate 4 and the clad layers 8, 11, 12 of the first semiconductor chip 2 (302) are made of InP. The active layer 9, and the passive layers 10, 27, are made of InGaAsP. The present invention is not limited to this. The N-type substrate 4, and the clad layers 8, 11, 12, may be made of InP, and the active layer 9, and the passive layers 10, 27, may be made of InGaAs/InGaAlAs, for example. This example enables the variable wavelength laser device 1 (301) to have a longer oscillation wavelength.

In the embodiments described above, the first semiconductor chip 2 and the second semiconductor chip 3 are bonded by flip chip bonding using solder. The present invention is not limited to this, and the first semiconductor chip 2 and the second semiconductor chip 3 may be bonded by performing flip chip bonding with electrodes crimped together and heated.

In the embodiments described above, an oscillation wavelength of the variable wavelength laser device 1 (301) is changed by heating the passive layers 10, 27 to change refractive indexes thereof. The present invention is not limited to this, the oscillation wavelength of the variable wavelength laser device 1 (301) may be changed by cooling the passive layers 10, 27 using a thermoelectric conversion element to change refractive indexes thereof, for example.

In the embodiments described above, a lower side of the passive layer 10 is solid. The present invention is not limited to this, and the lower side of the passive layer 10 may be formed in a hollow manner using a sacrificial layer etching technique, for example. As a result, the overall heat capacity is reduced, and effect of adjusting the refractive index of the passive layer 10 with less heater power can be obtained.

In the embodiments described above, the optical circuit 34 (311) provided in the second semiconductor chip 3 (303) is formed in the silicon layer 33. The present invention is not limited thereto, and the optical circuit 34 (311) may be formed in a layer made of another material, for example, a layer made of a combination of silicon nitride and silicon oxide. This example brings an advantage in that loss in the optical circuit 34 (311) can be reduced.

In the embodiments described above, a grating cycle and a coupling coefficient of the grating coupler 35 disposed in parallel at a predetermined distance in the Y-direction in FIG. 1A, are not described, and are typically constant. At this time, a ratio of guided light traveling in the X-axis direction (longitudinal direction) in FIG. 1A to be coupled with an upward radiation mode inside the grating coupler 35 is also constant, and intensity of radiated light decreases in an exponential manner in the grating coupler 35. Accordingly, an overlap integral with a fundamental waveguide mode on a first semiconductor chip (2, 302) side, which is approximated by a Gaussian shape, decreases, and a coupling efficiency also decreases. As described in Non-Patent Document (Applied Optics, Vol. 32, No. 12, 1993, pp 2112-2116) as a measure, when an etching depth of a grating, i.e., a coupling coefficient is adjusted to increase toward a central portion in the longitudinal direction and decrease toward an end therein, for example, intensity of output light forms a shape close to a Gaussian shape where the intensity becomes maximum near the center, and thus coupling efficiency with the fundamental guided mode can be improved. Besides, the coupling coefficient can also be adjusted by changing a ratio (filling ratio) of the groove in one grating cycle in the longitudinal direction or changing a grating cycle at a constant filling ratio.

(Aspects of the Present Invention)

Next, a variable wavelength laser device according to a first aspect of the present invention and a variable wavelength laser device production method according to a second aspect will be described using the reference numerals designated in the embodiments described above. It is to be understood that the reference numerals given to the respective components do not limit the scope of the present invention.

A first aspect of the present invention provides a variable wavelength laser device 1, 301 including: a first semiconductor chip 2, 302 having first and second waveguides 16, 17; 304, 305 disposed in parallel, a second semiconductor chip 3, 303 having an optical circuit 34, 311 that is optically connected to the first and second waveguides 16, 17; 304, 305 and constitutes a resonator in cooperation with the first and second waveguides 16, 17; 304, 305, the first and second waveguides 16, 17; 304, 305 each having two or more front surface electrodes 13, 15, 23, 25, and the second semiconductor chip 3 having a plurality of electrodes 38, 39, 40, 41 bonded to the corresponding front surface electrodes 13, 15, 23, 25 of the first and second waveguides 16, 17; 304, 305.

According to the first aspect of the present invention, the resonator includes the first and second waveguides 16, 17; 304, 305 disposed in parallel in the first semiconductor chip 2, 302 and the optical circuit 34, 311 provided in the second semiconductor chip 3, 303 as components, so that increase in length of the resonator enables obtaining a variable wavelength laser device 1, 301 with a narrow line width. In addition, the front surface electrode 13, 15, 23, 25 provided in the waveguides 16, 17; 304, 305 of the first semiconductor chip 2, 302 is bonded to the electrode 38, 39, 40, 41 of the second semiconductor chip 3, 303, so that both reduction in line width and reduction in size of the variable wavelength laser device can be achieved. Furthermore, flip chip bonding can be used for bonding the first semiconductor chip 2, 302 and the second semiconductor chip 3, 303, so that the alignment accuracy at the time of bonding can be improved to the order of microns, for example.

In one embodiment of the first aspect of the present invention, the first semiconductor chip 2, 302 is provided with the mirror 28 configured to reflect light traveling through the first and second waveguides 16, 17; 304, 305 to couple the light with the optical circuit 34, 311 of the second semiconductor chip 3, 303.

According to the present embodiment, effect that can be obtained by the first aspect of the present invention is specifically achieved by using the mirror 28 that can be provided by etching, for example.

In one embodiment of the first aspect of the present invention, each of the first and second waveguides 16, 17; 304, 305 includes at least two of the optical gain region 18, the reflective grating regions 19, 21, and the phase region 20.

According to the present embodiment, a wavelength adjustment function can be secured in the first semiconductor chip 2, 302 in which the first and second waveguides 16, 17; 304, 305 are provided.

In one embodiment of the first aspect of the present invention, the optical circuit 34, 311 includes the first and second grating couplers 35, 312 optically connected to the first and second waveguides 16, 17; 304, 305, respectively.

According to the present embodiment, effect that can be obtained by the first aspect of the present invention is specifically achieved by using the first and second grating couplers 35, 312 supporting the optical connection between the first and second waveguides 16, 17; 304, 305 and the optical circuit 34, 311.

In one embodiment of the first aspect of the present invention, the optical circuit 311 includes the multimode interference coupler 313 having the optical input-output ports connected to the first and second grating couplers 312 via the single mode waveguide 314, the third grating coupler 316 for extracting light output, optically connected to the multimode interference coupler 313, and the loop mirror 317 provided between the output port of the multimode interference coupler 313 and the third grating coupler 316.

In one embodiment of the first aspect of the present invention, the first semiconductor chip 2, 302 is formed of a compound semiconductor, and the second semiconductor chip 3, 303 is formed of a silicon-based semiconductor.

A second aspect of the present invention provides a production method 200 of the variable wavelength laser device 1, 301, the production method 200 including: step 201, 202 of preparing the first semiconductor chip 2, 302 having the first and second waveguides 16, 17; 304, 305 disposed in parallel; step 203, 204, 205 of preparing the second semiconductor chip 3, 303 having the optical circuit 34, 311, the first and second waveguides 16, 17; 304, 305 each having two or more of the front surface electrodes 13, 15, 23, 25, the second semiconductor chip 3, 303 having the plurality of electrodes 38, 39, 40, 41; and step 206 of bonding the front surface electrodes 13, 15, 23, 25 of the first and second waveguides 16, 17; 304, 305 to the corresponding plurality of electrodes 38, 39, 40, 41 of the second semiconductor chip 3, 303 by flip chip bonding to optically connect the first and second waveguides 16, 17; 304, 305 to the optical circuit 34, 311 to constitute a resonator.

According to the second aspect of the present invention, the resonator includes the first and second waveguides 16, 17; 304, 305 disposed in parallel in the first semiconductor chip 2, 302 and the optical circuit 34, 311 provided in the second semiconductor chip 3, 303 as components, so that increase in length of the resonator enables obtaining a variable wavelength laser device 1, 301 with a narrow line width. In addition, the front surface electrode 13, 15, 23, 25 provided in the waveguides 16, 17; 304, 305 of the first semiconductor chip 2, 302 is bonded to the electrode 38, 39, 40, 41 of the second semiconductor chip 3, 303, so that both reduction in line width and reduction in size of the variable wavelength laser device can be achieved. Furthermore, flip chip bonding is used for bonding the first semiconductor chip 2, 302 and the second semiconductor chip 3, 303, so that the alignment accuracy at the time of bonding can be improved to the order of microns, for example.

DESCRIPTION OF REFERENCE SYMBOLS 1, 301 VARIABLE WAVELENGTH LASER DEVICE
2, 302 FIRST SEMICONDUCTOR CHIP
3, 303 SECOND SEMICONDUCTOR CHIP
4 N-TYPE SUBSTRATE
8 N-TYPE CLAD LAYER
9 ACTIVE LAYER
10, 27 PASSIVE LAYER
11, 12 P-TYPE CLAD LAYER
13 P-SIDE ELECTRODE
14 N-SIDE ELECTRODE
15, 23, 25 HEATER ELECTRODE
16, 304 FIRST WAVEGUIDE
17, 305 SECOND WAVEGUIDE
18 GAIN REGION
19 FIRST REFLECTION GRATING REGION
20 PHASE REGION
21 SECOND REFLECTION GRATING REGION
22, 24, 26 THIN FILM HEATER
28 GROOVE
29 SILICON SUBSTRATE
29a NON-EXPOSED REGION (OF SILICON SUBSTRATE SURFACE)
29b EXPOSED REGION (OF SILICON SUBSTRATE SURFACE)
30 LAMINATE
33 SILICON LAYER
34 OPTICAL CIRCUIT
35 GRATING COUPLER
36 SINGLE MODE WAVEGUIDE
37 SPIRAL PORTION
38 to 41 POWER SUPPLY ELECTRODE
306 FIRST GAIN REGION
307 FIRST REFLECTION GRATING REGION
308 PHASE REGION
309 SECOND GAIN REGION
310 SECOND REFLECTION GRATING REGION
311 OPTICAL CIRCUIT
312 GRATING COUPLER
313 MULTIMODE INTERFERENCE COUPLER
314 SINGLE MODE WAVEGUIDE
315 SPIRAL PORTION
316 THIRD GRATING COUPLER
317 LOOP MIRROR

The invention claimed is:

1. A variable wavelength laser device comprising:
a first semiconductor chip having first and second waveguides disposed in parallel; and
a second semiconductor chip having an optical circuit that is optically connected to the first and second waveguides and constitutes a resonator in cooperation with the first and second waveguides,
the first and second waveguides each having two or more front surface electrodes, and
the second semiconductor chip having a plurality of electrodes bonded to the corresponding front surface electrodes of the first and second waveguides.

2. The variable wavelength laser device according to claim 1, wherein
the first semiconductor chip is provided with a mirror configured to reflect light traveling through the first and second waveguides to couple the light with the optical circuit of the second semiconductor chip.

3. The variable wavelength laser device according to claim 1, wherein
   each of the first and second waveguides has at least two of an optical gain region, a reflection grating region, and a phase region.

4. The variable wavelength laser device according to claim 1, wherein
   the optical circuit includes first and second grating couplers optically connected to the first and second waveguides, respectively.

5. The variable wavelength laser device according to claim 4, wherein
   the first and second grating couplers each have a grating cycle or a coupling coefficient that is spatially modulated.

6. The variable wavelength laser device according to claim 4, wherein
   the optical circuit includes a multimode interference coupler having optical input-output ports connected to the first and second grating couplers via a single mode waveguide, a third grating coupler for extracting light output, optically connected to the multimode interference coupler, and a loop mirror provided between the output port of the multimode interference coupler and the third grating coupler.

7. The variable wavelength laser device according to claim 1, wherein
   the first semiconductor chip is formed of a compound semiconductor, and
   the second semiconductor chip is formed of a silicon-based semiconductor.

8. A method of producing a variable wavelength laser device comprising the steps of:
   preparing a first semiconductor chip having the first and second waveguides disposed in parallel;
   preparing a second semiconductor chip having an optical circuit,
      the first and second waveguides each having two or more of the front electrodes, and
      the second semiconductor chip having a plurality of electrodes; and
   bonding the front surface electrodes of the first and second waveguides to the corresponding plurality of electrodes of the second semiconductor chip by flip chip bonding to optically connect the first and second waveguides to the optical circuit to constitute a resonator.

* * * * *